(12) United States Patent
Parker et al.

(10) Patent No.: US 7,307,426 B2
(45) Date of Patent: Dec. 11, 2007

(54) METHODS AND APPARATUS FOR UNPOWERED TESTING OF OPEN CONNECTIONS ON POWER AND GROUND NODES OF CIRCUIT DEVICES

(75) Inventors: Kenneth P. Parker, Ft. Collins, CO (US); Chris R. Jacobsen, Ft. Collins, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/179,978

(22) Filed: Jul. 12, 2005

(65) Prior Publication Data

US 2007/0013383 A1  Jan. 18, 2007

(51) Int. Cl.
*G01R 31/02* (2006.01)
(52) U.S. Cl. .................. 324/519; 324/509; 324/750
(58) Field of Classification Search ............. 324/519, 324/509, 530
See application file for complete search history.

(56) References Cited

U.S. PATENT DOCUMENTS

| | | | |
|---|---|---|---|
| 5,125,660 A | 6/1992 | Stahl | 324/537 |
| 5,391,993 A * | 2/1995 | Khazam et al. | 324/684 |
| 5,420,500 A | 5/1995 | Kerschner | 324/72.5 |
| 5,469,064 A * | 11/1995 | Kerschner et al. | 324/537 |
| 5,498,694 A | 3/1996 | Ruoslahti | 530/324 |
| 5,498,964 A | 3/1996 | Kerschner et al. | |
| 5,557,209 A * | 9/1996 | Crook et al. | 324/537 |
| 6,995,566 B2 * | 2/2006 | Yamaoka et al. | 324/519 |
| 7,057,395 B1 * | 6/2006 | Williamson | 324/519 |
| 2003/0057981 A1 * | 3/2003 | Hash | 324/755 |
| 2005/0099186 A1 * | 5/2005 | Parker et al. | 324/538 |

* cited by examiner

*Primary Examiner*—Anjan Deb
*Assistant Examiner*—John Zhu

(57) ABSTRACT

A method and apparatus for detecting open defects on grounded nodes of an electrical device using capacitive lead frame technology is presented. In accordance with the method of the invention, an accessible signal node that is capacitively coupled the grounded node is stimulated with a known source signal. A capacitive sense plate is capacitively coupled to the stimulated node and grounded node of the electrical device, and a measuring device coupled to the capacitive sense plate capacitively senses a resulting signal. The value of the capacitively sensed signal is indicative of the presence or non-presence of an open defect on one or both of the grounded node and stimulated signal node.

29 Claims, 9 Drawing Sheets

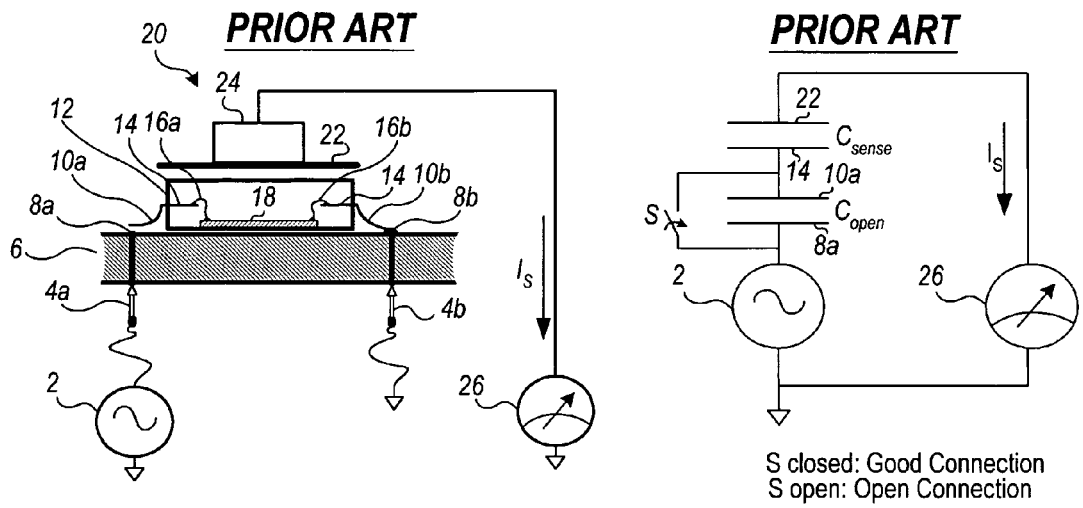
FIG. 1A
FIG. 1B
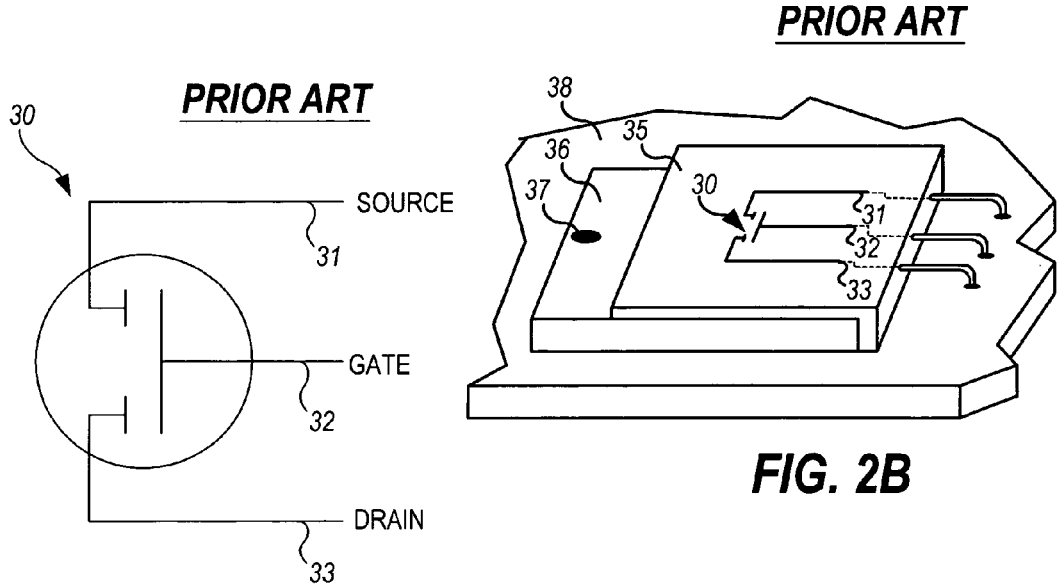
FIG. 2A
FIG. 2B

METHODS AND APPARATUS FOR UNPOWERED TESTING OF OPEN CONNECTIONS ON POWER AND GROUND NODES OF CIRCUIT DEVICES

BACKGROUND OF THE INVENTION

The present invention relates generally to integrated circuit testing, and more particularly to a method and apparatus for non-contact testing and diagnosing of open connections of power and ground nodes on unpowered circuit devices.

During the manufacture of circuit assemblies such as printed circuit boards (PCBs), multi-chip modules (MCMs), or other packaging hierarchies, testing for interconnection defects such as open and shorted joints or interconnects is performed. Well-known capacitance lead-frame sensing technologies exist that can detect opens between the pins of an integrated circuit (IC) and the mounting substrate (typically a PCB). Typical implementation of capacitive probe assemblies that implement a capacitive sensor may be found in the following references, each of which is incorporated herein by reference for all that it teaches: U.S. Pat. No. 5,498,964, to Kerschner et al., entitled "Capacitive Electrode System for Detecting Open Solder Joints in Printed Circuit Assemblies", U.S. Pat. No. 5,124,660 to Cilingiroglu, entitled "Identification of Pin-Open Faults By Capacitive Coupling Through the Integrated Circuit Package", U.S. Pat. No. 5,254,953 to Crook et al., entitled "Identification of Pin-Open Faults By Capacitive Coupling Through the Integrated Circuit Package", and U.S. Pat. No. 5,557,209 to Crook et al., entitled "Identification of Pin-Open Faults By Capacitive Coupling Through the Integrated Circuit Package".

U.S. Publication No. 20050242824 A1 published Nov. 3, 2005 and entitled "Methods And Apparatus For Non-Contact Testing And Diagnosing Open Connections For Connectors on Printed Circuit Boards" to Parker et al., incorporated herein by reference for all that it teaches, and assigned to the assignee of interest herein provides a method for testing for open power and ground connections in connectors and sockets, by making use of the inherently available coupling capacitors that exist between connector pins. When a signal pin is tested that is coupled to a nearby ground pin, an open on that ground pin will cause the signal pin measurement to rise in value.

For better understanding of the invention, a brief introduction to capacitive lead frame testing techniques is now presented. Turning to the drawings, FIG. 1A shows the basic setup and FIG. 1B shows the equivalent circuit model of capacitive lead-frame testing for open signal pins on an electrical circuit device embodied by an integrated circuit.

As shown, an integrated circuit (IC) die 18 is packaged in an IC package 12. The package 12 includes a lead frame 14 supporting a plurality of pins 10a, 10b. Pads of the IC die 18 are connected to the package pins 10a, 10b at the lead frame 14 via bond wires 16a, 16b. The pins 10a, 10b are supposed to be conductively attached, for example by way of solder joints, to pads 8a, 8b of a printed circuit board (PCB) 6. The test setup shown in FIG. 1A determines whether package pins are properly connected to the board at the solder joints. The test setup includes an alternating current (AC) source 2 that applies an AC signal, through a test probe 4a (and possibly other intervening circuitry, for example tester fixture adapters), to a node connected to the pad 8a on the PCB 6 to which a pin under test 10a should be electrically connected. In a typical test environment, the AC signal is typically 8192 Hz at 0.2 volts. A capacitive sensing probe 20 comprising a conductive sense plate 22 and amplifying buffer 24 is placed on top of the integrated circuit package 12. The capacitive sensing probe 20 is connected to a current measuring device 26, such as an ammeter. Another pin 10b of the integrated circuit 12 is connected to a circuit ground via a grounded probe 4b.

When the test is performed, the AC signal applied to pad 8a appears on the pin 10a of the integrated circuit package 12. Through capacitive coupling, in particular a capacitance $C_{sense}$ formed between the lead frame 14 and sense plate 22, a current $I_s$ is passed to the sense plate 22 and then through the amplifying buffer 24 to the current measuring device 26. If the measured current $I_s$ falls between predetermined limits, then the pin 10a is properly connected to the pad 8a. If the pin 10a is not connected to the pad 8a, a capacitance $C_{open}$ is formed between the pad 8a and pin 10a, altering the current $I_s$ measured by the current measuring device 26 such that the measured current $I_s$ falls outside the predetermined limits, thereby indicating that an open defect is present at the pin connection.

The above approaches focus on detection of open conditions on signal nodes of an integrated circuit device. It is well-known in the art that source power and ground connections of a circuit should be bypassed typically with bypass capacitors or dampening resistors in order to reduce signal variations on the circuit power source. Accordingly, during a capacitive lead frame test, the source power and ground nodes are typically grounded by the tester in order to remove the effects of the bypass elements from the test measurement setup. Because they must be grounded, source power and ground nodes cannot be tested using the standard capacitive sensing technique described above. Accordingly, it would be desirable to have a technique for applying capacitive sensing testing techniques to the detection of open defects on power and ground pins of a device.

In addition, many discrete components that may be connected on a PCB do not lend themselves easily to standard capacitive leadframe testing. FIG. 2A shows an electrical schematic of a discrete Field Effect Transistor (FET) 30, and FIG. 2B shows a physical packaged FET device 35 that may be discretely mounted on a PCB 38 or other such substrate. FETs such as that shown in FIGS. 2A and 2B are often mounted on PCBs 38 for the purpose of regulating and/or generating power supplies. Such FETs are often comparatively large to support high current capacity and heat dissipation, and often have integral heat sinks 36 that are bolted 37 to the board 38, as shown in FIG. 2B.

Currently known testing techniques for determining connectivity of terminals of discrete FET devices mounted on boards include In-Circuit measurement of drain-to-source impedance. Capacitive leadframe testing may also be performed on the gate terminal; however, because the drain 33 and source 31 terminals are typically bypassed (with a bypass capacitor or dampening resistor), prior capacitive leadframe testing only tested for gate 32 connectivity. Other testing techniques may involve turning on power to measure the effect of turning on/off the FET. Each of these tests have varying disadvantages and lack of coverage. Turning on power may be especially troublesome since the board may be defective and subject to damage.

Individual FET devices may also be connected in parallel to boost current capacity of the circuit design. Accordingly, their terminals may be ganged, drain-to-drain, source-to-source, and gate-to-gate. In this configuration, conventional electrical tests for these FET devices are not able to detect open connections at the terminals since there are parallel paths for current flow. Waiting until a functional test stage (where power must be turned on) to find FET defects may be risky. Accordingly, a need also exists for an unpowered method to find open defects on all FET terminals, regardless of single or parallel FET connections.

SUMMARY OF THE INVENTION

The present invention is a method for detecting open defects on source power and ground nodes of an electrical device using capacitive lead frame technology. In accordance with the method of the invention, an accessible signal node that is inherently capacitively coupled to a source power and/or ground node is stimulated with a known source signal. A capacitive sense plate is capacitively coupled to the stimulated signal node and the power and/or ground node of the electrical device, and a measuring device coupled to the capacitive sense plate measures a capacitance or other capacitively coupled signal (such as current) that is capacitively coupled between the capacitive sense plate and both the stimulated signal node and power and/or ground nodes of the electrical device. The value of the capacitively sensed signal, relative to a known expected "defect-free" capacitively sensed signal measurement, is indicative of whether the stimulated signal node and the capacitively coupled power and/or ground nodes are properly connected, and if not, on which of the stimulated signal node or the capacitively coupled power and/or ground node the open defect exists.

The invention is applied in a specific application to detection of open connections between the source, gate, and drain terminals of a discrete FET device and nodes of a PCB to which the terminals should be connected.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein:

FIG. 1A is a cross-cut side view of a basic test setup for testing for open signal pins on an integrated circuit using conventional capacitive lead-frame testing techniques;

FIG. 1B is a schematic diagram illustrating the equivalent circuit of the test setup of FIG. 1A;

FIG. 2A shows a conventional electrical schematic of a discrete Field Effect Transistor (FET);

FIG. 2B shows a conventional physical packaged FET device discretely mounted on a PCB;

DETAILED DESCRIPTION

The present invention will be described in detail with reference to illustrative embodiments wherein the device under test is alternatively an integrated circuit and a discrete FET device, and the accessible nodes are input and/or output signal joints (taking the form of pads, pins, wire bonds, solder bumps, or other now-known or hereinafter developed electrical interconnects for joining input and/or output nodes of an integrated circuit to a printed circuit board). It will be appreciated that the present invention may be similarly applied to other types of electrical devices or circuit components and nodes thereon. The illustrative embodiments are presented by way of example only and not limitation, and it is intended that the invention be limited only by the claims.

As used herein, the term "node" refers to the conductive portion of an electrical device that forms a single electrical point in the equivalent schematic diagram of the electrical device. A node can be a pad of an integrated circuit die, a component lead, a pin, a wire, a solder bump, or other interconnecting joint of an integrated circuit device, a pad or trace of a printed circuit board, an interconnecting joint of a component on the printed circuit board, or any combination thereof.

Figure 3:
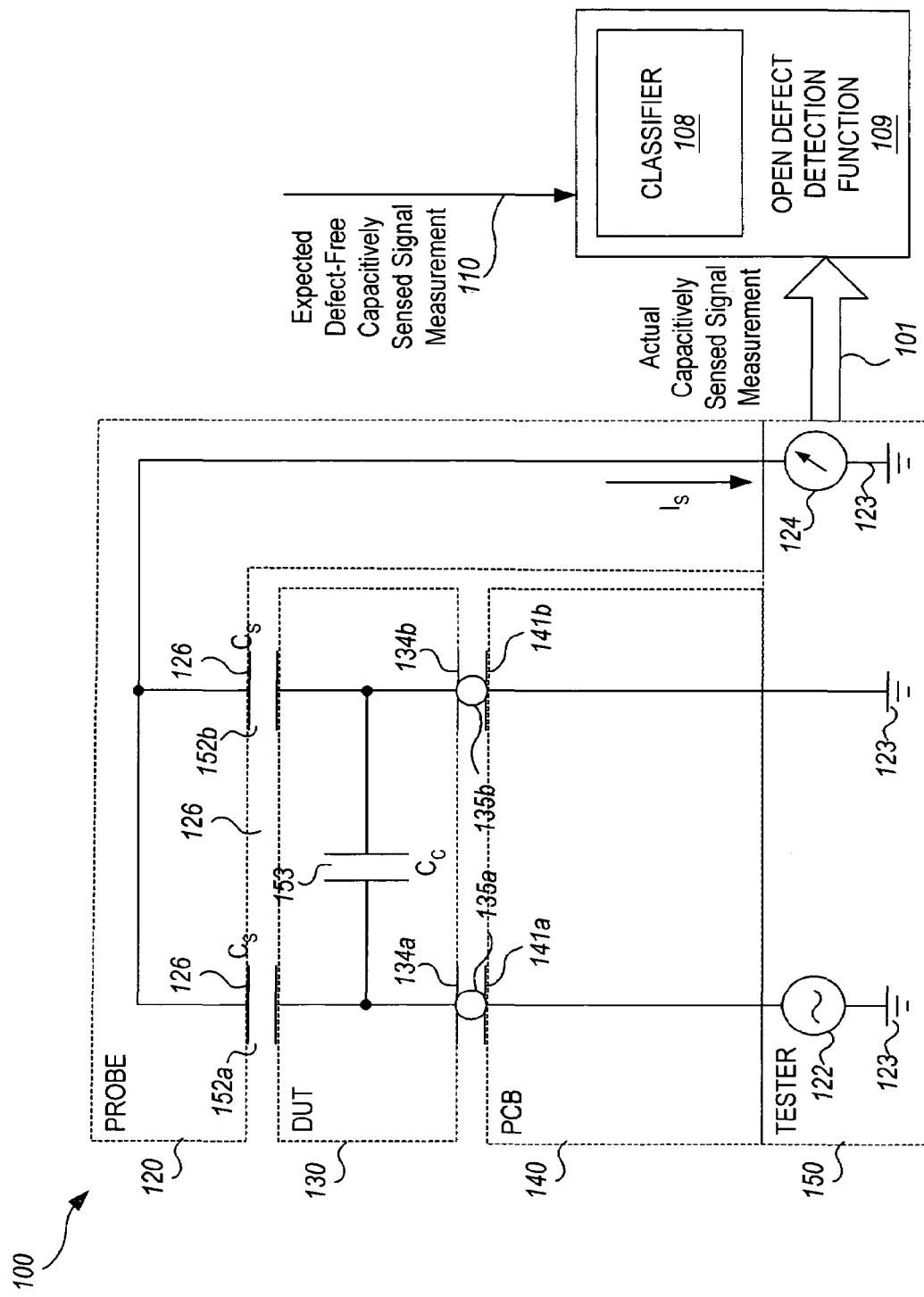
FIG. 3 is a schematic diagram of a test setup for testing for open defects on source power or ground nodes of an integrated circuit using capacitive lead-frame testing techniques in accordance with the invention.

Turning now to the invention, FIG. 3 illustrates a test setup 100 in accordance with the invention where a device under test (DUT) 130 is connected to a printed circuit board (PCB) 140 with solder joints 135$a$, 135$b$. A capacitive sense plate 126 sits above the device under test 130 and couples to each joint 135$a$, 135$b$ with a sense capacitance $C_s$ 152$a$, 152$b$. Joints 135$a$, 135$b$ are inherently coupled to each other by coupling capacitance $C_c$ 153.

Joint 135$a$ is a signal node. Joint 135$b$ is a node that for whatever reason is guarded for testing by connecting it to the circuit ground 123. For example, joint 135$b$ may be a source power node connected to the power plane ($V_{CC}$) of an IC device or may be a ground node connected to the ground plane of the IC device. During normal operation of a circuit, power and ground nodes of this type typically require signal bypassing implemented using a bypass capacitor or dampening resistor. During an unpowered capacitive leadframe test, the effects of these bypassing devices must be nullified by connecting both terminals (i.e., at the power and ground nodes) to ground.

There may be other devices also attached to this wiring. The present discussion considers the most likely case that this wiring only connects to joints of other integrated circuits. Since the capacitive lead-frame test technique uses very small stimulus voltages, these device joints cannot be forward-biased and therefore cannot consume any current themselves. If other devices such as passive components (e.g., termination resistors) are connected to this joint, then such other devices must be considered in a model of the circuit. However, for simplicity of analysis, devices such as passive components are not considered in the illustrative embodiment.

The invention allows detection of an open circuit or open connection (herein referred to as an "open defect") on either or both of joints 135a and 135b (joint 135b by virtue of its parasitic relationship to joint 135a).

Figure 4:
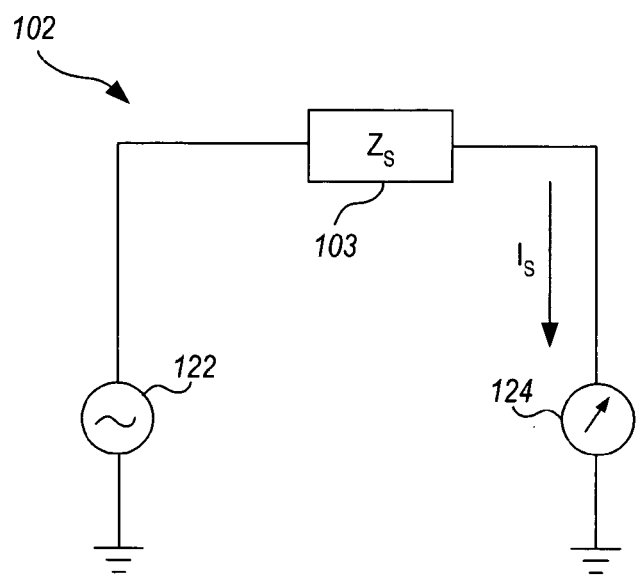
FIG. 4 is a circuit model of the measurement circuit of FIG. 2 when the source power or ground node of the circuit in FIG. 3 does not have an open defect.
Figure 5:
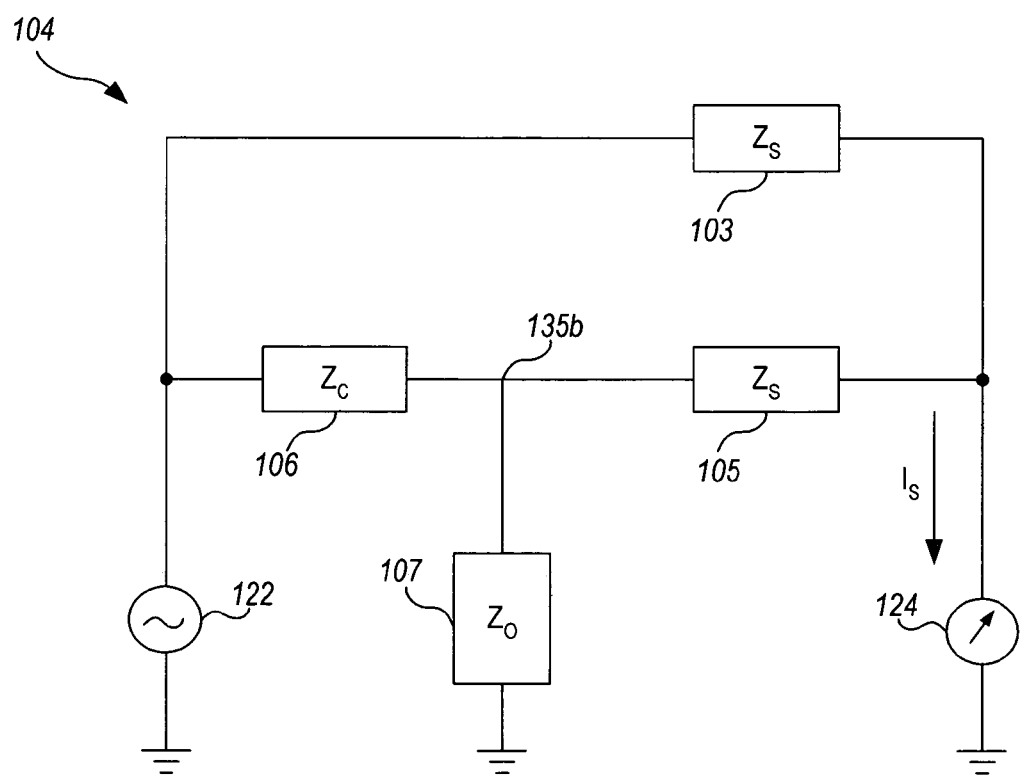
FIG. 5 is a circuit model of the measurement circuit of FIG. 2 when the source power or ground node of the circuit in FIG. 3 does have an open defect.

Consider two cases:

(1) Guarded (i.e., grounded) joint 135b is not defective (i.e., does not have an open defect) as modeled at 102 in FIG. 4 (the defect-free case), and (2) Guarded joint 135b has an open defect, as modeled at 104 in FIG. 5.

In the defect-free model 102 as illustrated in FIG. 4, $Z_S$ 103 represents the impedance of the capacitance $C_S$ between joint 135a and the sense plate 126. In the defect-free model 102, only the capacitance due to the signal joint 135a is sensed by the sense plate 126. The AC voltage source frequency and capacitance $C_C$ between joints 135a and 135b is shunted directly to ground. Thus, a current $I_S$ is sensed, where $$I_S = \frac{V}{Z_S}.$$

The current measurement can be converted back to a capacitance, referred to herein as the effective capacitance $C_{Eff}$ of the circuit, using the following equation:

$$C_{EFF} = \frac{I_S}{V}\left(\frac{1}{2\pi f}\right),$$

where $I_S$ is the measured current, V is the amplitude of the AC stimulus voltage, and f is the frequency of the AC stimulus voltage.

FIG. 5 illustrates the model 104 of the measurement circuit when joint 135b is open. As illustrated in FIG. 5, when joint 135b is open, the shunt to ground does not exist, creating an impedance $Z_O$ 107 of the capacitance between joint 135b and ground. Because joint 135b is not grounded, current flows across impedance $Z_C$ 106 due to coupling capacitance $C_C$ 153, and an additional capacitance $Z_S$ 105 is present between the joint 135b and sensor plate 126, thereby providing an additional current flow path to the sensor. This results in an elevated capacitance measurement for the capacitance sensed. This current $I_s$ when joint 135b is open is given by:

$$I_S = \frac{V}{Z_S} + \frac{V*Z_O}{Z_C Z_O + Z_C Z_S + Z_O Z_S}.$$

As before, the measured current $I_s$ can be converted back to a capacitance $C_{Eff}$.

Thus, when a source power or ground node is close by, and is therefore capacitively coupled to, a stimulated signal node, an elevated capacitance or current sense measurement is indicative of an open defect on the power or ground node. Referring back to FIG. 3, the measurement $I_S$ can be sent to an open defect detection function 109 that may include a classifier 108 that will classify the source power and/or ground node (and possibly also the stimulated signal node) as being characterized by the presence or non-presence of an open defect. An open defect on the power or ground node is distinguishable from an open defect on the stimulated signal node because an open defect on the stimulated signal node would result in a reduced capacitive or current sense measurement. Thus, one can differentiate between an open defect on the stimulated signal node versus an open defect on the power/ground node by noting the sign of the difference from an expected defect-free measurement 110.

Figure 6A:
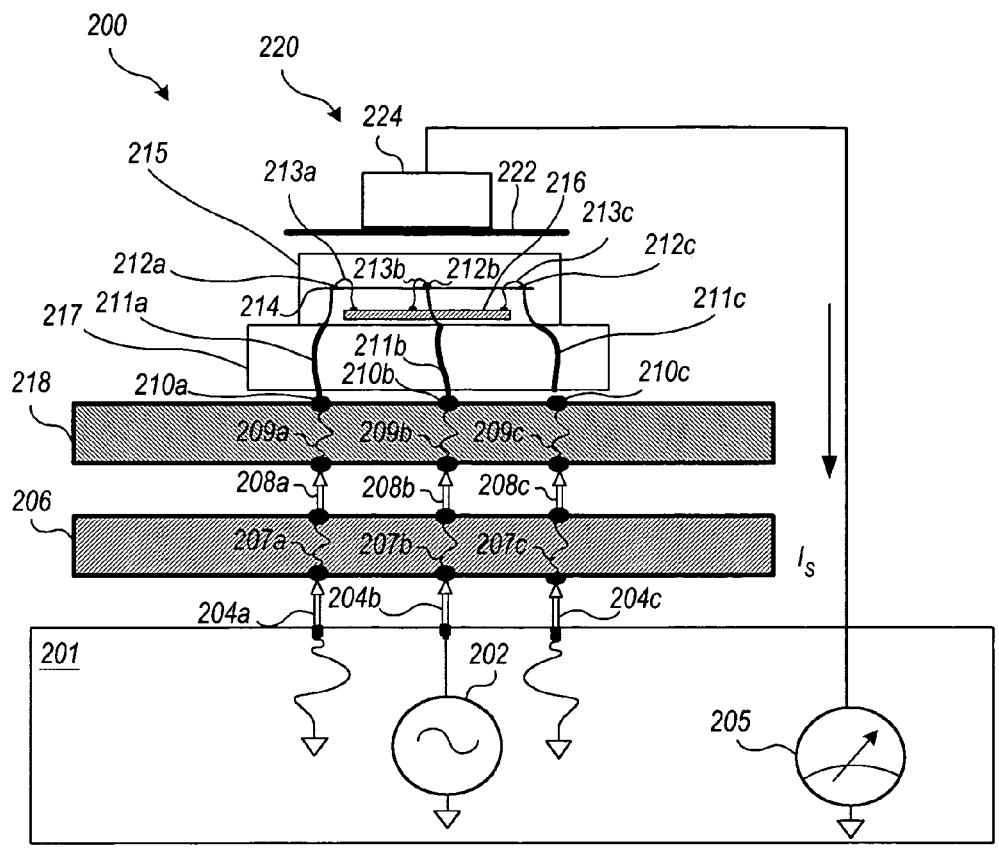
FIG. 6A is a side cross-sectional view of a capacitive leadframe test setup for testing a FET device mounted horizontally on a PCB.
Figure 6B:
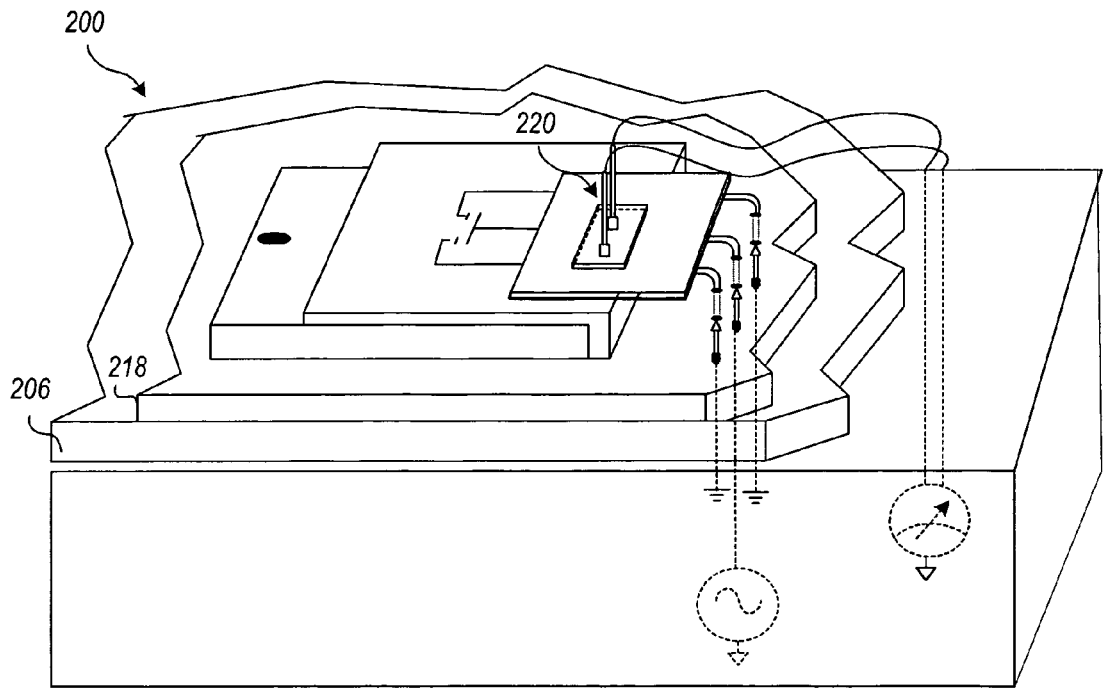
FIG. 6B is a perspective view of the test setup of FIG. 6A.

Turning now to a specific application of the present invention, FIGS. 6A and 6B respectively illustrate a cross-sectional side view and a perspective view of a capacitive sensing test setup 200 for detection open defects on the joints 210a, 210b, 210c connecting the source, gate, and drain terminals 211a, 211b, 211c of a power FET device 215 to respective nodes on a PCB 218.

The power FET device 215 is implemented on an integrated circuit die 216 and packaged and mounted on an integral heat sink 217 that is mounted on the PCB 218. The source, drain, and gate terminal nodes 212a, 212b, 212c of the FET implemented on the die 216 are connected via respective bondwires 213a, 213b, 213c to the IC leadframe 214, which in turn are connected to respective package terminals 211a, 211b, 211 c. Package terminals 211a, 211b, 211c are supposed to be connected to the PCB 218 by respective solder joints 210a, 210b, 210c.

An in-circuit tester 201 is configured to test the electrical integrity of the solder joints 210a, 210b, 210c. In this regard, the tester 201 includes a plurality of tester interface pins 204a, 204b, 204c that probe nodes on the bottom side of a test fixture 206. The probed nodes on the bottom side of the test fixture 206 are connected, typically by way of personality pins 207a, 207b, 207c to corresponding probes 208a, 208b, 208c on the top side of the test fixture 206. Probes 208a, 208b, 208c probe nodes on the bottom side of the PCB 218, which are connected typically via internal trace routing to the solder joint nodes 210a, 210b, 210c on the top side of the PCB 218. Accordingly, nodes on the top side of the PCB 218 may be stimulated or grounded as needed to perform in-circuit tests of the PCB 218.

In the illustrated configuration of the FET device 215, the gate terminal 211b is positioned between the source terminal 211a and drain terminal 211c. Accordingly, the gate terminal 211b is capacitively coupled to both the source terminal 211a and the drain terminal 211c. The technique of the invention may therefore be advantageously applied to detect open defects on any of the source, gate, or drain nodes 210a, 210b, 210c.

In this regard, the tester 201 is configured to ground the nodes (i.e., the solder joints) on the top side of the PCB 218 to which the source and drain terminals 211a, 211c should be electrically connected. The tester 201 is also configured to stimulate the solder joint 210b to which the gate terminal 211b of the FET device 215 should be connected.

The sensor plate 222 of a capacitive sensing probe 220 is positioned on the FET package 215 or in close proximity over the FET nodes 212a, 212b, 212c and/or over the FET package terminals 211a, 211b, 211c. A signal that is capacitively coupled between the FET device 215 and the sensor plate 222 is amplified by probe amplifier 224 and measured, for example by an ammeter 205.

Tester software compares the measured signal with an expected defect-free capacitance measurement associated with the FET device under test. If the actual measurement is within the expected defect-free capacitance measurement range, this is indicative that all three terminals 211a, 211b, and 211c are properly electrically connected to the PCB 218 at respective solder joints 210a, 210b, 210c. If the actual measurement is less than the expected defect-free capacitance measurement range, this is indicative that the gate terminal 211b has an open defect, for example at solder joint 210b. If the actual measurement is above the expected defect-free capacitance measurement range, this is indicative that one or both of the source and drain terminals 211a, 211c have an open defect, for example at solder joint 210a and/or 210c. Test software can be configured to automatically make these comparisons and to identify and classify the respective joints associated with the FET under test 215.

Figure 7A:
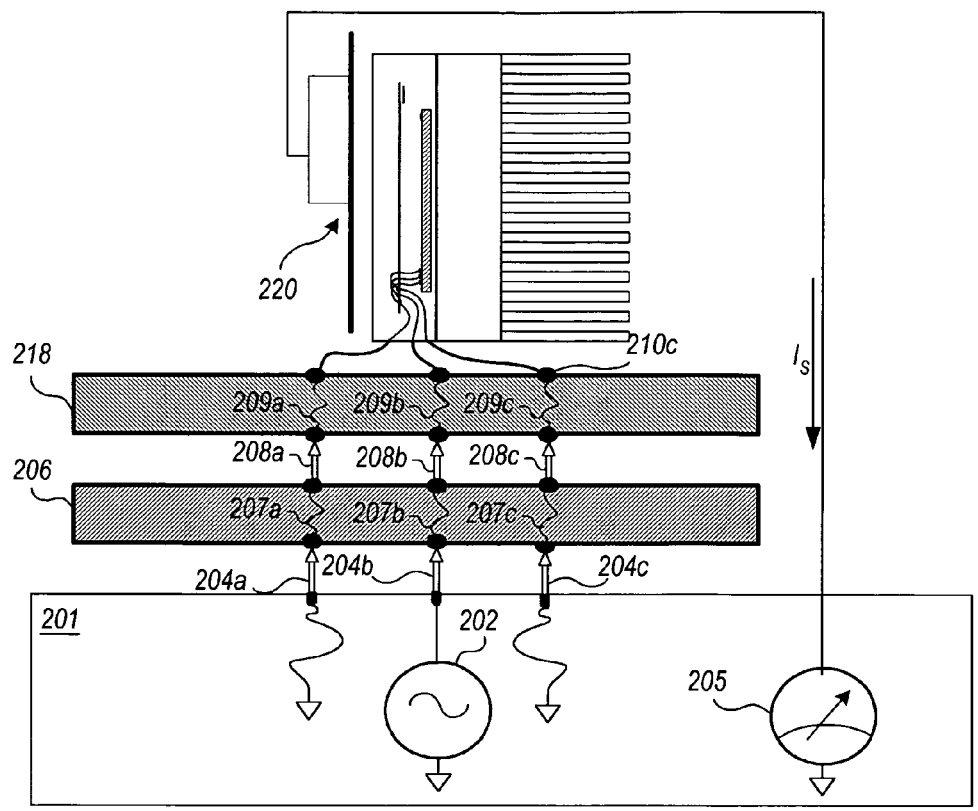
FIG. 7A is a side cross-sectional view of a capacitive leadframe test setup for testing a FET device mounted vertically on a PCB.
Figure 7B:
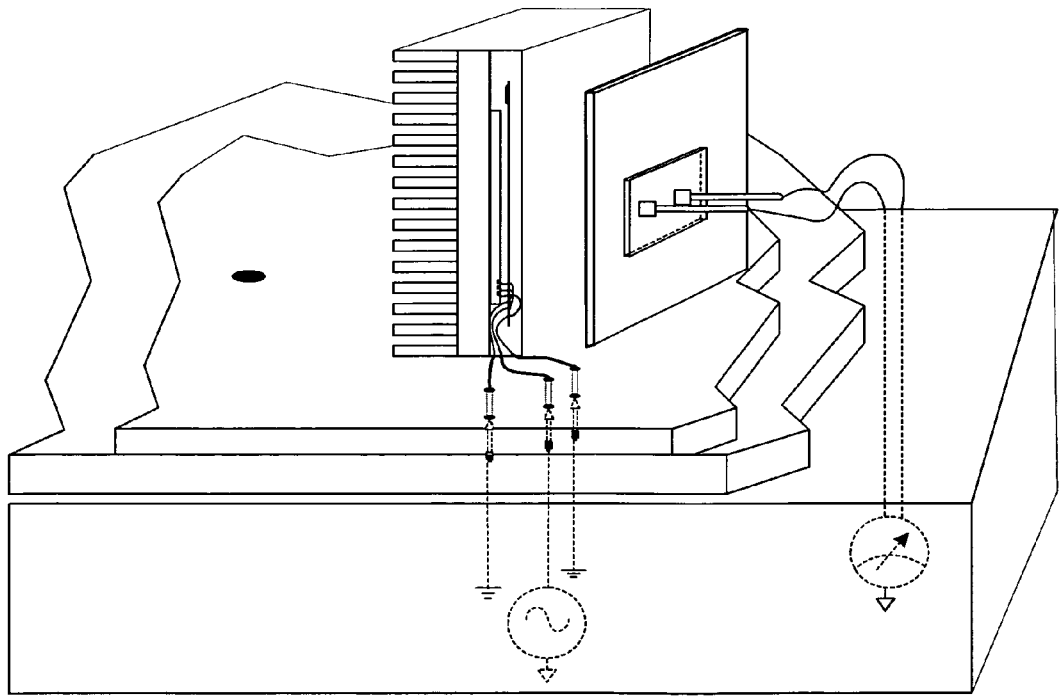
FIG. 7B is a perspective view of the test setup of FIG. 7A.

FIGS. 6A and 6B illustrate a FET device 215 mounted horizontally to the PCB plane. In some PCBs, however, these discrete FET devices may be mounted in a position vertical to the PCB plane. FIGS. 7A and 7B illustrate a test setup for obtaining capacitive measurements of a vertically mounted FET. In this configuration, the sensor plate 222 of the capacitive sensing probe 220 is also positioned vertical to the PCB plane, as shown in FIGS. 7A and 7B.

Figure 8A:
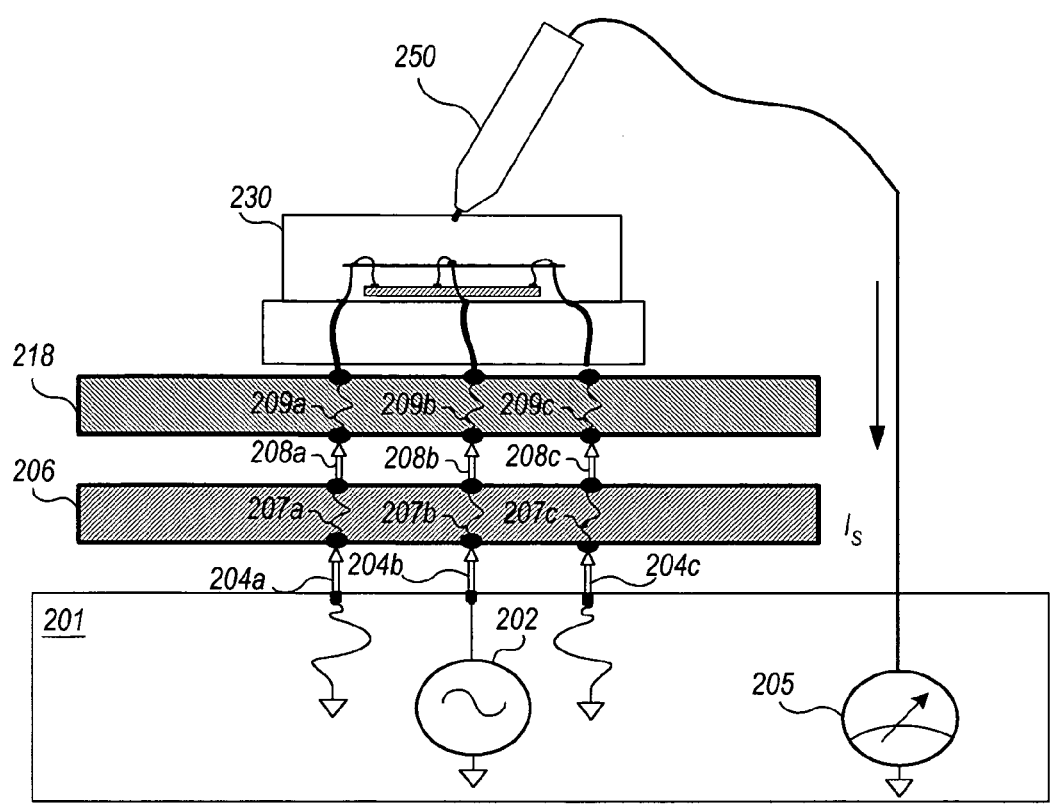
FIG. 8A is a side cross-sectional view of a capacitive leadframe test setup using an ohmic contact probe for testing a FET device mounted within a floating conductive container on a PCB.
Figure 8B:
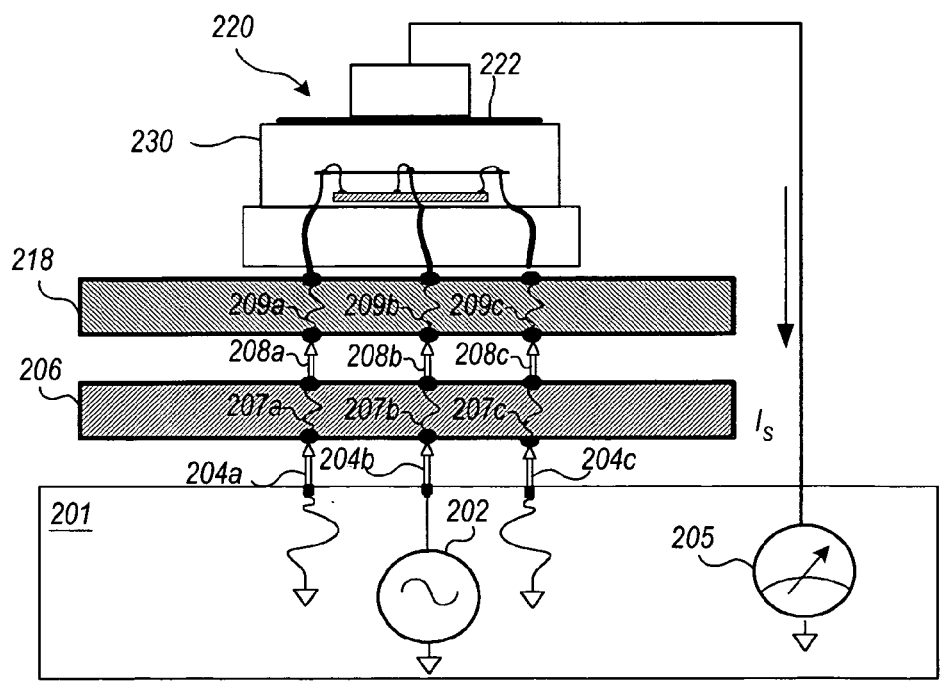
FIG. 8B is a side cross-sectional view of a capacitive leadframe test setup using a capacitive sensing probe for testing a FET device mounted within a floating conductive container on a PCB.

Some discrete FET devices may be mounted within a metal can or container on the PCB. If the container is electrically floating, then a capacitance measurement can be obtained by directly contacting the container with an ohmic contact, or by capacitively coupling into the container with a large enough sensor plate mounted in close proximity to the container. FIGS. 8A and 8B illustrate a test setup for obtaining capacitive measurements of a metal enclosed FET. In this configuration, an ohmic contact probe 250 directly contacts the container 230, as shown in FIG. 8A, or the sensor plate 222 of a capacitive sensing probe 220 is positioned on, or in close proximity to, the container 230, as shown in FIG. 8B.

Clearly, it will be appreciated by those skilled in the art that the techniques of the present invention can be applied to other electrical devices with similar characteristics (i.e., signal nodes accessible to the tester for probing/stimulating and nearby (capacitively coupled) power/ground nodes that are accessible to the tester for grounding). Examples of such devices include, but are not limited to: IC components, discrete silicon devices such as NPN and PNP transistors, etc., connected singly, serially, or in parallel.

Figure 9A:
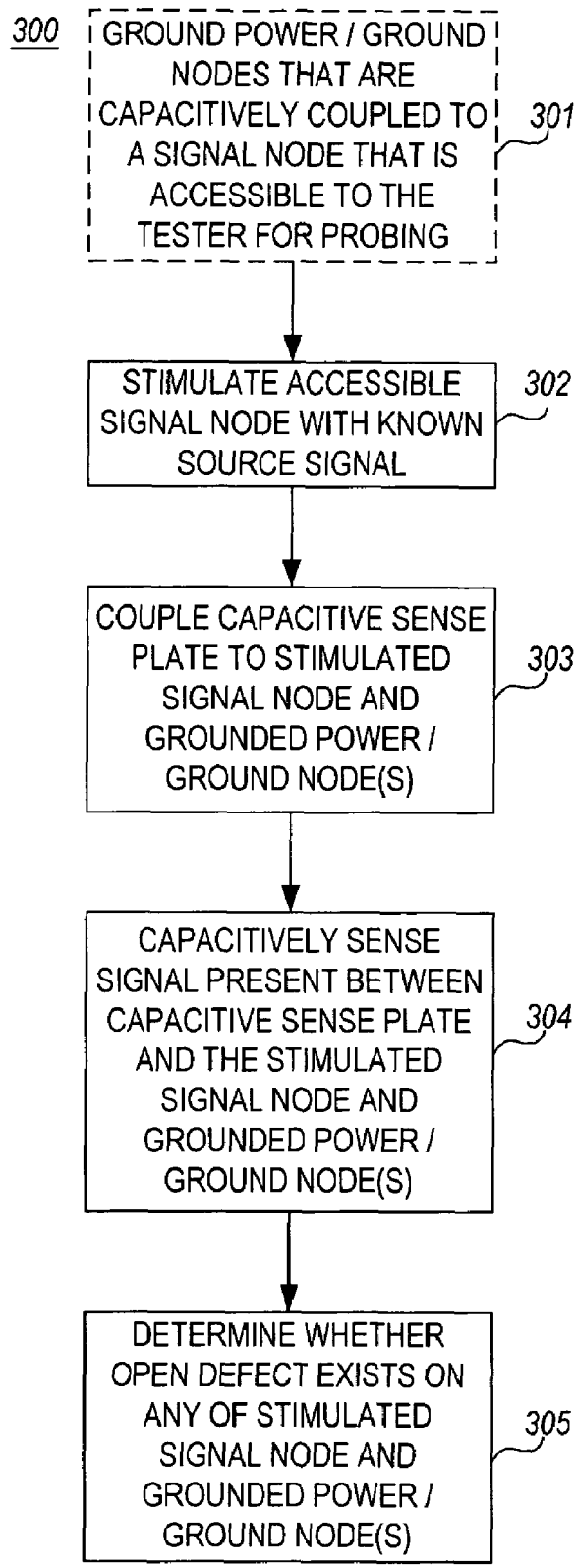
FIG. 9A is a flowchart illustrating a preferred method of the invention for detecting open defects on power and/or ground nodes of an electrical device.

FIG. 9A is a flowchart illustrating a preferred method 300 of the invention for detecting open defects on power/ground nodes of an electrical device. In this method, power/ground nodes that are capacitively coupled to a signal node that is accessible to the tester for probing are grounded (step 301). The accessible signal node is then stimulated with a known source signal (step 302). A capacitive sense plate is capacitively coupled to the stimulated signal node and the grounded power/ground node(s) (step 303). A measuring device coupled to the capacitive sense plate measures a signal capacitively coupled from the stimulated signal node and grounded power/ground node(s) (304). The capacitively sensed signal is representative of the effective capacitance between the capacitive sense plate and the stimulated signal node and grounded power/ground node(s). Based on the value of the capacitively sensed signal measurement, the electrical integrity of the stimulated signal node and grounded power/ground node(s) can be determined (step 305).

Figure 9B:
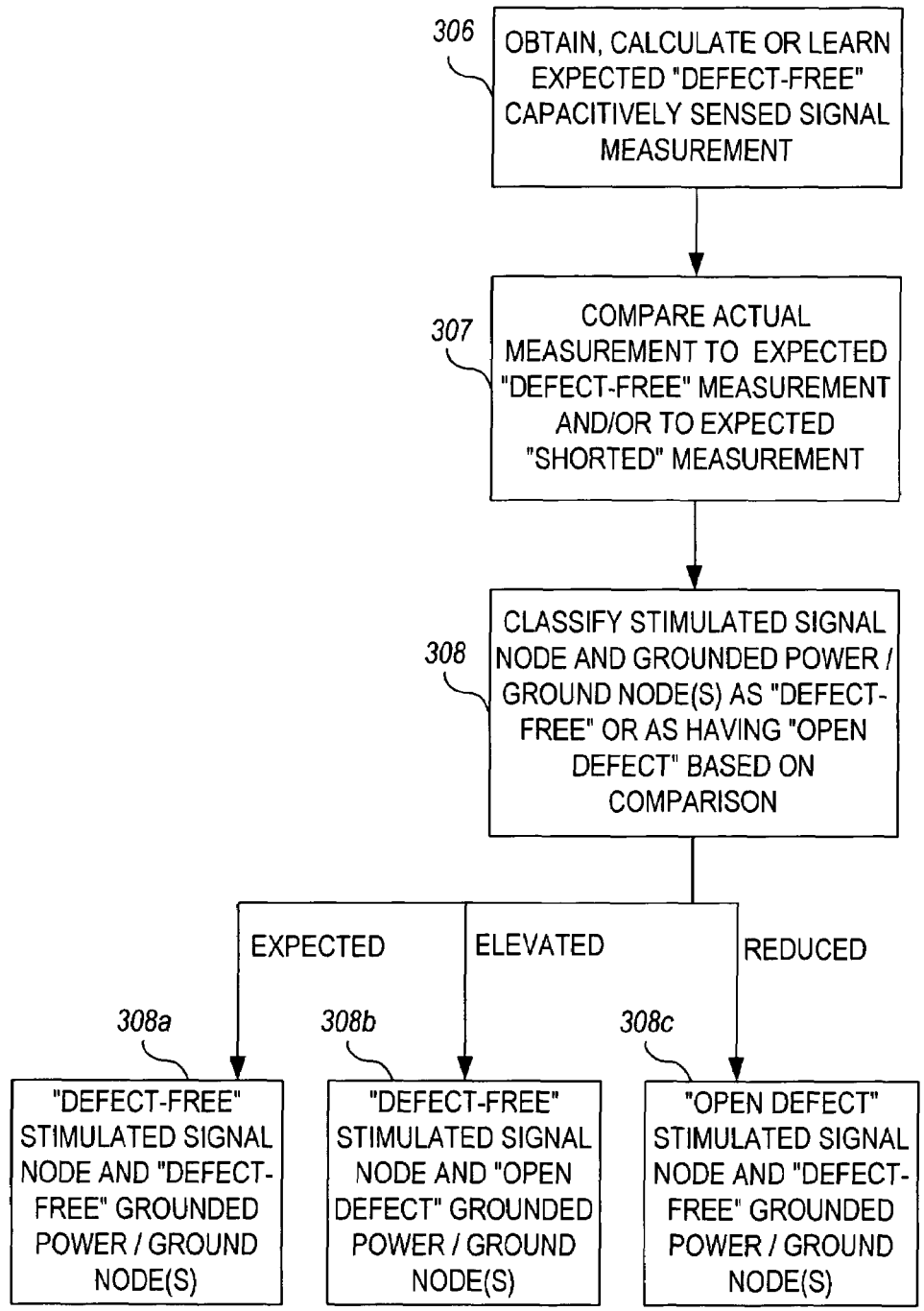
FIG. 9B is an exemplary embodiment for determining whether open defects on power and/or ground nodes of an electrical device based on the value of the capacitively sensed signal.

In particular, FIG. 9B illustrates an exemplary embodiment for determining whether an open defect exists on the stimulated signal node and grounded power/ground node(s) based on the value of the capacitively sensed signal measurement. An expected defect-free capacitively sensed signal measurement is obtained (step 306). This expected measurement may be obtained through theoretical calculation or through measurements on a "known good board" (i.e., a device under test that is known to be defect free).

The actual measurement is then compared with the obtained defect-free measurement (step 307). The stimulated signal node and grounded power/ground node(s) are then classified as "defect-free" or "open defect" based on the results of the comparison (step 308). If the actual capacitively sensed signal measurement is substantially close to (i.e., within a guardband of) the expected "defect-free" capacitively sensed signal measurement, each of the stimulated signal node and the nearby grounded power/ground node(s) is classified as "defect-free" (step 308a) since if any of these nodes had an open defect, the actual measurement would result in either a reduced measurement (if due to an open defect on the stimulated signal node(s)) or an elevated measurement (if due to an open defect on the grounded power/ground node(s)).

If the actual capacitively sensed signal measurement is less than (i.e., less than a guardband of) the expected "defect-free" capacitively sensed signal measurement, the stimulated signal node is classified as having an "open defect" and the nearby grounded power/ground node(s) are classified as being "defect-free" (step 308b) since it is known that a reduced measurement is indicative of an open defect on the stimulated signal node(s) only.

If the actual capacitively sensed signal measurement is above (i.e., greater than a guardband of) the expected "defect-free" capacitively sensed signal measurement, the stimulated signal node is classified as being "defect-free" and the nearby grounded power/ground node(s) are classified as having an "open defect" (step 308c) since it is known that an elevated measurement is indicative of an open defect on the grounded power/ground node(s) only.

Figure 10A:
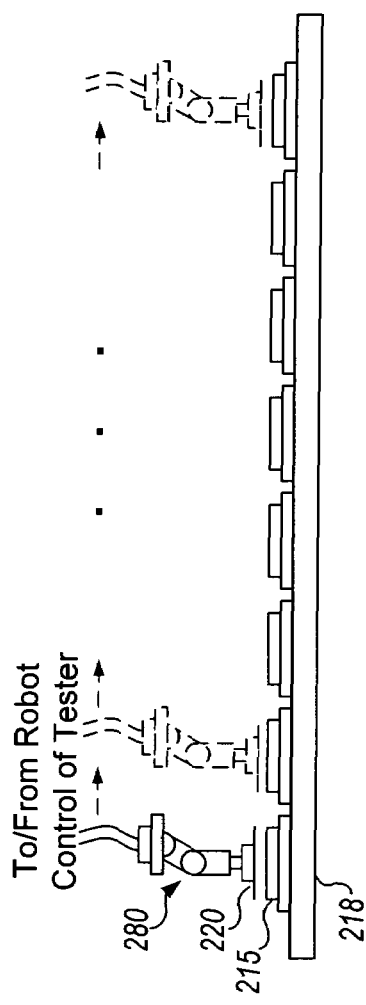
FIG. 10A is a side cross-sectional view of a capacitive leadframe test setup which uses a robotic arm to serially move a capacitive sensing probe over each of a plurality of FET devices mounted in parallel on a PCB.
Figure 10B:
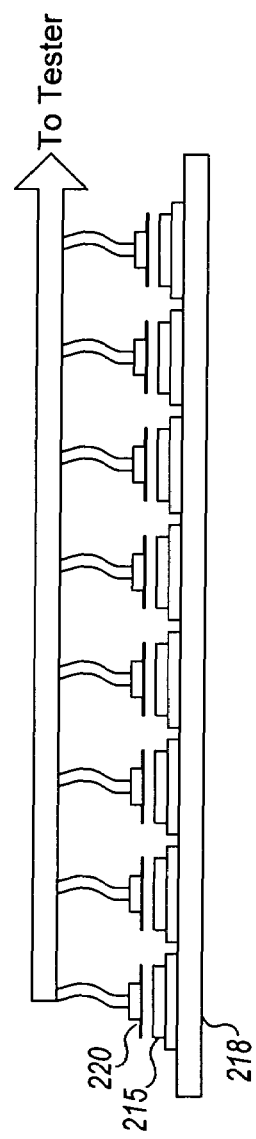
FIG. 10B is a side cross-sectional view of a capacitive leadframe test setup allowing parallel measurements of multiple FET devices mounted in parallel on a PCB.

On a given device under test such as a PCB, if several FET devices are connected in parallel, then each individual FET device can be tested individually to allow detection of open defects on each individual FET device. This can be achieved by moving the sensor plate 222 of a capacitive sensing probe 222 to each individual FET device to obtain a corresponding measurement and to make corresponding conclusions thereof, for example by way of a robotic arm 280 as shown in FIG. 10A, or can be achieved by providing each individual FET device with its own, independently observable, capacitive sensing probe to allow the gates of each individual FET device to be stimulated and the corresponding measurements to be obtained in parallel, as shown in FIG. 10B.

Although this preferred embodiment of the present invention has been disclosed for illustrative purposes, those skilled in the art will appreciate that various modifications, additions and substitutions are possible, without departing from the scope and spirit of the invention as disclosed in the accompanying claims. It is also possible that other benefits or uses of the currently disclosed invention will become apparent over time.

What is claimed is:

1. A method for detecting an open defect on a grounded node of an electrical device, the method comprising the steps of:
   stimulating an accessible signal node of the electrical device that is capacitively coupled to the grounded node with a known source signal;
   capacitively sensing a signal representative of an effective capacitance between a sensor of a capacitive sensing probe and the stimulated signal node and the grounded node; and
   determining whether an open defect exists on the grounded node of the electrical device based on the capacitively sensed signal.

2. A method in accordance with claim 1, comprising the step of:
   classifying the grounded node as having an open defect if the capacitively sensed signal is elevated from an expected capacitively sensed signal.

3. A method in accordance with claim 1, comprising the step of:
   classifying the grounded node as not having an open defect if the capacitively sensed signal is substantially close to an expected capacitively sensed signal.

4. A method in accordance with claim 1, comprising the step of:
   classifying the stimulated signal node as having an open defect if the capacitively sensed signal is substantially below an expected capacitively sensed signal.

5. A method in accordance with claim 1, comprising the step of:
   classifying the stimulated signal node as not having an open defect if the capacitively sensed signal is substantially close to an expected capacitively sensed signal.

6. A method in accordance with claim 1, wherein:
   the electrical device comprises an integrated circuit;
   the accessible signal node comprises an input and/or output joint of the integrated circuit; and
   the grounded node comprises a power or ground node of the integrated circuit.

7. A method in accordance with claim 1, wherein:
   the electrical device comprises a discrete FET device
   the accessible node comprises a gate terminal of the discrete FET device; and
   the grounded node comprises a drain terminal and/or source terminal of the discrete FET device.

8. A method in accordance with claim 7, wherein the discrete FET device is positioned parallel to a mounting plane of a board on which the discrete FET device is mounted, and the sensor of the capacitive sensing probe is positioned over the discrete FET device parallel to the mounting plane of the board on which the discrete FET device is mounted.

9. A method in accordance with claim 7, wherein the discrete FET device is positioned perpendicularly to a mounting plane of a board on which the discrete FET device is mounted, and the sensor of the capacitive sensing probe is positioned next to the discrete FET device perpendicularly to the mounting plane of the board on which the discrete FET device is mounted.

10. A method in accordance with claim 7, wherein the discrete FET device is substantially enclosed in an electrically floating conductive container, the step for capacitively sensing a signal representative of an effective capacitance between a sensor of a capacitive sensing probe and the stimulated signal node and the grounded node comprising the steps of: placing the sensor of the capacitive sensing probe in ohmic contact with the container.

11. A method in accordance with claim 10, wherein the capacitive sensing probe is formed by placing an ohmic contact probe in electrical contact with the container.

12. A method in accordance with claim 7, wherein the discrete FET device is substantially enclosed in an electrically floating conductive container, the step for capacitively sensing a signal representative of an effective capacitance between a sensor of a capacitive sensing probe and the stimulated signal node and the grounded node comprising the steps of:
   placing the sensor of the capacitive sensing probe in close proximity to the container.

13. A method in accordance with claim 1, comprising:
performing the method in parallel for a plurality of respective electrical devices mounted on a printed circuit board.

14. A method for detecting an open defect on a node under test of an electrical device, the method comprising the steps of:
   grounding the node under test;
   stimulating an accessible signal node of the electrical device that is capacitively coupled to the grounded node under test with a known source signal;
   capacitively sensing a signal representative of an effective capacitance between a sensor of a capacitive sensing probe and the stimulated signal node and the grounded node under test; and
   determining whether an open defect exists between on the grounded node under test of the electrical device based on the capacitively sensed signal.

15. A method in accordance with claim 14, comprising the step of:
   classifying the grounded node as having an open defect if the capacitively sensed signal is elevated from an expected capacitively sensed signal.

16. A method in accordance with claim 14, comprising the step of:
   classifying the grounded node as not having an open defect if the capacitively sensed signal is substantially close to an expected capacitively sensed signal.

17. A method in accordance with claim 14, comprising the step of:
   classifying the stimulated signal node as having an open defect if the capacitively sensed signal is substantially below an expected capacitively sensed signal.

18. A method in accordance with claim 14, comprising the step of:
   classifying the stimulated signal node as not having an open defect if the capacitively sensed signal is substantially close to an expected capacitively sensed signal.

19. A method in accordance with claim 14, wherein:
   the electrical device comprises an integrated circuit;
   the accessible signal node comprises an input and/or output joint of the integrated circuit; and
   the grounded node comprises a power or ground node of the integrated circuit.

20. A method in accordance with claim 14, wherein:
   the electrical device comprises a discrete FET device
   the accessible node comprises a gate terminal of the discrete FET device; and
   the grounded node comprises a drain terminal and/or source terminal of the discrete FET device.

21. A method in accordance with claim 20, wherein the discrete FET device is positioned parallel to a mounting plane of a board on which the discrete FET device is mounted, and the sensor of the capacitive sensing probe is positioned over the discrete FET device parallel to the mounting plane of the board on which the discrete FET device is mounted.

22. A method in accordance with claim 20, wherein the discrete FET device is positioned perpendicularly to a mounting plane of a board on which the discrete FET device is mounted, and the sensor of the capacitive sensing probe is positioned next to the discrete FET device perpendicularly to the mounting plane of the board on which the discrete FET device is mounted.

23. A method in accordance with claim 20, wherein the discrete FET device is substantially enclosed in an electrically floating conductive container, the step for capacitively sensing a signal representative of an effective capacitance between a sensor of a capacitive sensing probe and the stimulated signal node and the grounded node comprising the steps of:

placing the sensor of the capacitive sensing probe in ohmic contact with the container.

24. A method in accordance with claim 23, wherein the capacitive sensing probe is formed by placing an ohmic contact probe in electrical contact with the container.

25. A method in accordance with claim 20, wherein the discrete FET device is substantially enclosed in an electrically floating conductive container, the step for capacitively sensing a signal representative of an effective capacitance between a sensor of a capacitive sensing probe and the stimulated signal node and the grounded node comprising the steps of:

placing the sensor of the capacitive sensing probe in close proximity to the container.

26. A method in accordance with claim 14, comprising:
performing the method in parallel for a plurality of respective electrical devices mounted on a printed circuit board.

27. An apparatus for detecting an open defect on a node under test of an electrical device, comprising:

means for grounding the node under test;

a signal source which stimulates an accessible signal node of the electrical device that is capacitively coupled to the grounded node under test with a known source signal;

a capacitive sensing probe which capacitively senses a signal representative of an effective capacitance between a sensor of the capacitive sensing probe and the stimulated signal node and the grounded node under test; and an open defect detection function which determines whether an open defect exists on the grounded node under test based on the capacitively sensed signal.

28. An apparatus in accordance with claim 27, comprising:

a classification function which receives an expected defect-free capacitively sensed signal measurement, compares the capacitively sensed signal to the expected defect-free capacitively sensed signal measurement, and classifies the node under test as having an open defect if the capacitively sensed signal measurement is substantially elevated from the expected defect-free capacitively sensed signal measurement.

29. An apparatus in accordance with claim 27, comprising:

robotic means for positioning the capacitive sensing probe in close proximity to the stimulated signal node and the grounded node under test.

* * * * *

UNITED STATES PATENT AND TRADEMARK OFFICE
CERTIFICATE OF CORRECTION

PATENT NO. : 7,307,426 B2
APPLICATION NO. : 11/179978
DATED : December 11, 2007
INVENTOR(S) : Parker et al.

It is certified that error appears in the above-identified patent and that said Letters Patent is hereby corrected as shown below:

On the Title page, item (56), under "U.S. Patent Documents", in column 1, line 1, delete "5,125,660 A 6/1992 Stahl 324/537" and insert -- 5,124,660 6/1992 Cilingiroglu 324/538 --, therefor.

In column 9, line 46, in Claim 7, after "device" insert -- ; --.

In column 10, line 63, in Claim 20, after "device" insert -- ; --.

Signed and Sealed this

Tenth Day of June, 2008

JON W. DUDAS
*Director of the United States Patent and Trademark Office*